(12) United States Patent
Isshiki et al.

(10) Patent No.: US 8,802,506 B2
(45) Date of Patent: Aug. 12, 2014

(54) METHOD OF MANUFACTURING A SEMICONDUCTOR DEVICE AND A SEMICONDUCTOR DEVICE PRODUCED THEREBY

(75) Inventors: Minoru Isshiki, Chiba (JP); Tomoko Kato, Ichihara (JP); Yoshitsugu Morita, Ichihara (JP); Hiroshi Ueki, Ichihara (JP)

(73) Assignee: Dow Corning Toray Company, Ltd., Chiyoda-Ku, Tokyo (JP)

( * ) Notice: Subject to any disclaimer, the term of this patent is extended or adjusted under 35 U.S.C. 154(b) by 1356 days.

(21) Appl. No.: 12/280,248

(22) PCT Filed: Feb. 14, 2007

(86) PCT No.: PCT/JP2007/053131
§ 371 (c)(1),
(2), (4) Date: Apr. 14, 2010

(87) PCT Pub. No.: WO2007/099823
PCT Pub. Date: Sep. 7, 2007

(65) Prior Publication Data
US 2010/0213623 A1 Aug. 26, 2010

(30) Foreign Application Priority Data
Feb. 23, 2006 (JP) ................... 2006-046872

(51) Int. Cl.
*H01L 21/00* (2006.01)
(52) U.S. Cl.
USPC ........... 438/127; 438/112; 438/124; 438/126; 438/781

(58) Field of Classification Search
USPC .......... 438/112, 124, 126, 127, 781
See application file for complete search history.

(56) References Cited

U.S. PATENT DOCUMENTS

| | | | | |
|---|---|---|---|---|
| 5,157,061 A | * | 10/1992 | Ito et al. | 523/433 |
| 5,169,919 A | * | 12/1992 | Terae et al. | 528/15 |
| 5,512,640 A | | 4/1996 | Osawa et al. | |
| 5,962,139 A | * | 10/1999 | Hagiwara et al. | 428/413 |
| 6,162,878 A | * | 12/2000 | Osada et al. | 525/481 |

(Continued)

FOREIGN PATENT DOCUMENTS

| | | |
|---|---|---|
| JP | 06056999 A | 3/1994 |
| JP | 08244064 A | 9/1996 |

(Continued)

OTHER PUBLICATIONS

English language translation and abstract for JP 06056999 extracted from PAJ database, dated Jun. 30, 2008, 68 pages.

(Continued)

*Primary Examiner* — Bac Au
(74) *Attorney, Agent, or Firm* — Howard & Howard Attorneys PLLC (57) ABSTRACT

A method of manufacturing a semiconductor device sealed in a cured silicone body by placing an unsealed semiconductor device into a mold and subjecting a curable silicone composition which is fed into the space between the mold and the unsealed semiconductor device to compression molding, the method being characterized by the fact that the aforementioned curable silicone composition comprises at least the following components: (A) an epoxy-containing silicone and (B) a curing agent for an epoxy resin; can reduce warping of the semiconductor chips and circuit board, and improve surface resistance to scratching.

18 Claims, 2 Drawing Sheets

(56) References Cited

U.S. PATENT DOCUMENTS

| | | |
|---|---|---|
| 6,441,106 B1 * | 8/2002 | Goda et al. .................... 525/487 |
| 7,651,887 B2 * | 1/2010 | Morita et al. .................. 438/106 |
| 7,651,958 B2 * | 1/2010 | Morita et al. .................. 438/781 |
| 2002/0015748 A1 | 2/2002 | Miyajima et al. |
| 2003/0071366 A1 | 4/2003 | Rubinsztajn et al. |
| 2005/0037537 A1 | 2/2005 | Kim et al. |
| 2005/0129957 A1 | 6/2005 | Kashiwagi et al. |

FOREIGN PATENT DOCUMENTS

| | | | |
|---|---|---|---|
| JP | 11077733 | A | 3/1999 |
| JP | 2000277551 | A | 10/2000 |
| JP | 2004296555 | A | 10/2004 |
| JP | 2005183788 | A | 7/2005 |
| JP | 2005268565 | A | 9/2005 |
| WO | WO 2005062368 | A1 | 7/2005 |
| WO | WO 2006011676 | A1 | 2/2006 |

OTHER PUBLICATIONS

English language translation and abstract for JP 08244064 extracted from PAJ database, dated May 29, 2008, 41 pages.

English language translation and abstract for JP 11077733 extracted from PAJ database, dated May 29, 2008, 35 pages.

English language abstract for JP 2000277551 extracted from espacenet.com database, dated Feb. 2, 2009.

English language translation and abstract for JP 2004296555 extracted from PAJ database, dated Feb. 2, 2009, 60 pages.

English language translation and abstract for JP 2005183788 extracted from PAJ database, dated Feb. 2, 2009, 69 pages.

English language translation and abstract for JP 2005268565 extracted from PAJ database, dated Feb. 2, 2009, 51 pages.

PCT International Search Report for PCT/JP2007/053131, dated May 29, 2007, 4 pages.

* cited by examiner

METHOD OF MANUFACTURING A SEMICONDUCTOR DEVICE AND A SEMICONDUCTOR DEVICE PRODUCED THEREBY

RELATED APPLICATIONS

This application claims priority to and all the advantages of International Patent Application No. PCT/JP2007/053131, filed on Feb. 14, 2007, which claims priority to Japanese Patent Application No. 2006-046872, filed on Feb. 23, 2006.

TECHNICAL FIELD

The present invention relates to a method of manufacturing a semiconductor device and to a semiconductor device produced by the method.

BACKGROUND ART

Sealing of a semiconductor device in resin is performed by various methods such as transfer-molding in a mold, potting or screen printing with a liquid sealing resin, etc. In accordance with the recent trend to miniaturize semiconductor components and to diminish and reduce the thickness of electronic devices, it may be required in some cases to seal packages as thin as 500 μm or less in resin.

Although the sealing of thin packages in resin by the transfer-mold method allows precise control of the sealing-resin thickness, this method nevertheless encounters problems associated with phenomena such as movements of the semiconductor chip in the flow of sealing resin and deformation of bonding wires which are connected to the semiconductor chip under the effect of pressure in the flow of liquid resin, as well as breakage of wires or contact thereof with each other.

On the other hand, sealing of semiconductor devices in liquid resin by methods of potting or screen printing protects the bonding wires from breakage or mutual contact, however, these methods make it more difficult to control the thickness of the sealing-resin layer and increase the possibility of formation of voids in the material of the resin.

In order to solve the above problems, it was proposed to manufacture resin-sealed semiconductor devices by placing each unsealed semiconductor device into a mold and subjecting the sealing resin, which fills the space between the mold and the unsealed semiconductor device, to compression molding (see Japanese Unexamined Patent Application Publications (hereinafter referred to as "Kokai") H08-244064, Kokai H11-77733, and Kokai 2000-277551).

However, when a conventional epoxy resin composition is used as a sealing material in the above-mentioned method of compression molding and when semiconductor chips are miniaturized and printed circuit boards are too thin, the aforementioned chips and printed circuit boards are subject to increased buckling and can easily develop inner stress that may lead to breakage or malfunction of the sealed semiconductor device.

In order to overcome the above problems, a method was proposed to seal a semiconductor device in a cured, soft silicone body by placing the unsealed semiconductor device into a mold, filling the space between the mold and the unsealed semiconductor device with various curable silicone compositions and then subjecting the aforementioned compositions to compression molding (see Kokai 2004-296555, Kokai 2005-183788, and Kokai 2005-268565).

However, the surfaces of cured silicone bodies are fragile and have low resistance to scratching; therefore, the surfaces of the semiconductor devices treated by the above method can be easily damaged in manufacturing processes, and handling of the device becomes problematic.

It is an object of the present invention to provide a method for efficiently manufacturing semiconductor devices which are characterized by reduced buckling of semiconductor chips and circuit boards and which have surfaces with improved resistance to scratching. It is another object to provide a semiconductor device manufactured by the above method.

DISCLOSURE OF INVENTION

The invention provides a method of manufacturing a semiconductor device sealed in a cured silicone body by placing an unsealed semiconductor device into a mold and subjecting a curable silicone composition which is fed into a space between the mold and the unsealed semiconductor device to compression molding, the method being characterized by the fact that the aforementioned curable silicone composition comprises at least the following components: (A) an epoxy containing silicone and (B) a curing agent for an epoxy resin.

The invention also provides a semiconductor device manufactured by the aforementioned method.

EFFECTS OF INVENTION

The method of the invention for manufacturing semiconductor devices is characterized by efficiency of manufacturing of semiconductor devices with reduced buckling of semiconductor chips and circuit boards, and with improved resistance to scratching on the surfaces of the devices.

REFERENCE NUMBERS

10: semiconductor chip
12: printed circuit board
14: cured silicone body
16: semiconductor device
20: stationary platen
22: lower base
23: lower half-mold
24: heater
26: lower clamp stopper
30: moveable platen
32: upper base
33: upper holder
34: upper half-mold
34a: cavity recess portion
36: clamper
36a, 36b: air-suction holes
37: spring
38: heater
39: upper clamp stopper
40a, 40b: peelable films 42a, 42b: feeding rolls
44a, 44b: film-receiving rolls
46: guide roller
48: static charge remover
50: curable silicone composition

DETAILED DESCRIPTION OF THE INVENTION

The following is a detailed description of the method of the invention for manufacturing a semiconductor device.

According to the proposed method, an unsealed semiconductor device is sealed in a cured body of silicone by placing the semiconductor device into a mold and subjecting the curable silicone composition that fills the space between the mold and the semiconductor device to compression molding.

The compression molding machine that contains the aforementioned mold may be a conventional compression molding machine that contains an upper half-mold and a lower-half mold that, when closed together, squeeze the unsealed semiconductor device and form a mold cavity into which the curable silicone composition is supplied for filling the space between the mold and the unsealed semiconductor device. The machine is equipped with a clamping device for pressing the upper and lower half-molds to each other, a heater for curing and heating the curable silicone composition, and with other devices. Such a compression molding machine is disclosed, e.g., in Kokai H08-244064, Kokai H11-77733, and Kokai 2000-277551. The machine described in Kokai 2000-277551 is preferable for consideration because it has the simplest construction.

More specifically, the compression molding machine disclosed in Kokai 2000-277551 makes it possible to place an unsealed semiconductor device into a lower half-mold, supply a curable silicone composition into the spaces between the upper half-mold and the unsealed semiconductor device, clamp the semiconductor device between the upper half-mold and lower half-mold, and subject the curable silicone composition to compression molding. The aforementioned machine has a clamper made in the form of a frame that encloses side faces of the sealing area of the upper half-mold. The clamper is supported so that it can freely move vertically in the direction of closing and opening the mold along the aforementioned side faces and so that, when the mold is open, the clamper's lower end face projects from the molding face of the upper half-mold and is biased to the lower half-mold. When the lower half-mold or upper half-mold is in direct contact with the curable silicone composition, its molding surfaces can be easily coated with a fluororesin. In particular, the aforementioned compression-molding machine is provided with a device for feeding a peelable film from the mold and the cured silicone body to positions where it can cover the sealing area of the upper half-mold. In such a machine, sealing of the unsealed semiconductor device by means of the peelable film protects the cured silicone body from sticking to the molding surface of the mold, reliably seals the sealing area, and prevents formation of burrs.

The aforementioned compression molding machine may also be provided with a feeding mechanism for feeding the peelable film from the mold and cured silicone body to a position where it can cover the molding surface that may support the semiconductor device in the lower half-mold. Furthermore, the machine is equipped with an air-suction mechanism that applies a suction action to the peelable film on the lower end face of the clamper and to the peelable film on the inner surface of the sealing area by sucking air from the inner bottom surface of the sealing area formed by the inner face of the clamper and the molding surface of the upper half-mold. Provision of the aforementioned suction mechanism reliably holds and seals the peelable film on the molding surfaces. Alternatively, a suction mechanism for holding the peelable film may be comprised of air-suction holes open to the lower end face of the clamper and air-suction holes that communicate with an air flow formed in the space between the inner side surface of the clamper and the side surface of the upper mold. Suction action is caused by connecting the aforementioned openings to an air-suction unit. The upper half-mold may have on its molding surface a cavity that forms an independent molding portion corresponding to a semiconductor-element placement position on the semiconductor device. Furthermore, the lower half-mold also may have a cavity that forms an independent molding portion corresponding to a placement position of the semiconductor chip on the semiconductor device. The upper half-mold is moveable in the direction of opening or closing of the mold and is urged toward the lower half-mold. An overflow cavity is formed on the molding surface of the lower half-mold for providing an overflow of the curable silicone composition from the sealing area during sealing of the semiconductor device. A gate or gates, which are communicated to the overflow cavity and the sealing area may be formed on the clamping surface of the clamper that applies pressure to the semiconductor device.

When in a semiconductor sealing operation an unsealed semiconductor device is placed into the lower half-mold, a curable silicone composition is fed to the space between the upper half-mold and the semiconductor device, the peelable film from the mold and the cured silicone body covers the surfaces of the sealing area, the semiconductor device is squeezed between the upper and lower half-molds together with the curable silicone composition and is sealed. Under these conditions, the clamper that forms a frame that embraces the side surfaces of the sealing area of the upper half-mold freely moves in the vertical direction along the aforementioned side surfaces, projects with its lower end face below the molding surface of the upper half-mold, is urged to the lower half-mold, and seals the periphery of the sealing area; and while the lower and upper half-molds gradually approach each other, the curable liquid silicone composition fills the sealing area, the half-molds stop in the closed position of the mold, and the semiconductor device is sealed by the curable silicone composition in the sealing area.

Figure 1:
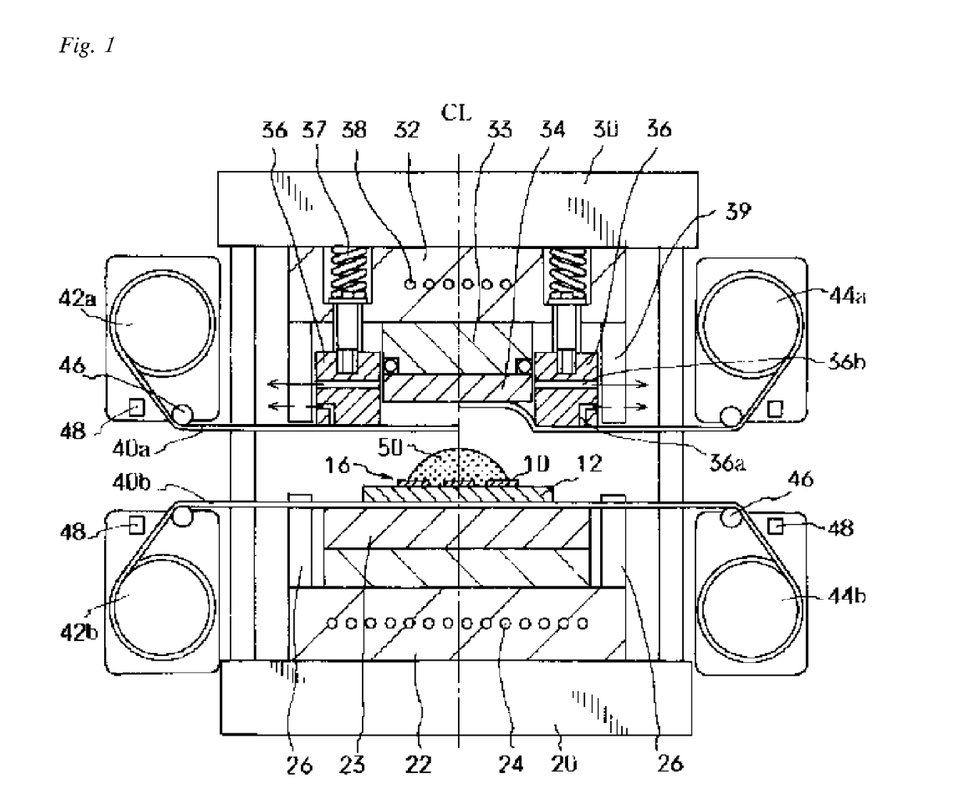
FIG. 1 is a view that illustrates the structure of a compression molding machine used for manufacturing semiconductor devices by the method of the invention.

FIG. 1 shows main structural parts of the compression-molding machine suitable for carrying out the method of the invention. In this drawing, reference numeral 20 designates a stationary platen, and reference numeral 30 designates a moveable platen. Both platens are incorporated into a press. The press may comprise an electrically driven press or a hydraulic press capable of performing the appropriate sealing operation by driving the moveable platen in the vertical direction.

Reference numeral 22 designates a lower half-mold base that is fixed to the stationary platen 20, and reference numeral 23 designates a lower half-mold that is fixed to the lower half-mold base 22. The upper surface of the lower half-mold 23 has a setting section for placing a semiconductor device 16. The semiconductor device 16 used in the method of the present invention may contain a plurality of semiconductor chips 10 installed on a printed circuit board 12 at equal distances from each other. The semiconductor device 16 faces upwardly from the lower half-mold 23. Reference numeral 24 designates a heater attached to the lower half-mold base 22. The heater 24 is intended for heating the lower half-mold 23, and thus increases the temperature of the semiconductor device 16 supported by the lower half-mold 23. The machine is provided with a lower clamp stopper 26 that defines a clamping position for the upper and lower half-molds. The clamp stoppers 26 are installed on the lower base 22.

Reference numeral 32 designates an upper half-mold base that is fixed to the moveable plate 30. Reference numeral 33 is an upper half-mold holder fixed to the upper half-mold base 32, and reference numeral 34 designates an upper half-mold fixed to the upper half-mold holder 33. In the method of the present embodiment, the semiconductor chips 10 are arranged and sealed on one side of the printed circuit board 12, which is flat. Therefore, in the sealing area the molding face of the upper half-mold 34 is also made flat. Reference numeral 36 designates a clamper made in the form of a frame that encloses side faces of the upper half-mold 34 and the upper half-mold holder 33. The clamper 36 is supported by the upper half-mold base 32 with free vertical movements and is biased towards the lower half-mold 23 by a spring 37. The molding face of the upper half-mold 34 is shifted from the end face of the clamper 36, and a sealing area is formed in a closed state of the mold between the inner face of the clamper 36 and the molding face of the upper half-mold 34. The biasing force of the clamper 36 may be developed by means other than the spring, e.g., by a pneumatic cylinder.

Reference numeral 38 designates a heater that is arranged in the upper half-mold base 32 and is intended for heating the upper half-mold holder 33 and the upper half-mold 34, so that the semiconductor device 16 can be heated when the mold is closed; reference numeral 39 designates upper clamp stoppers that are installed on the upper half-mold base 32. The upper clamp stoppers 39 and the lower clamp stoppers 26 are arranged on the side of the upper half-mold and on the side of the lower half-mold, respectively, so that in a closed state of the mold their end faces come into mutual contact. When the moveable platen 30 is moved downward by the press unit, the upper clamp stoppers 39 contact the lower clamp stopper 26 in the clamping position. The aforementioned closed position defines the thickness of the sealing curable silicone composition layer formed in the sealing area.

Reference numeral 40a and 40b designate longitudinally arranged peelable films having width dimensions sufficient to cover the molding faces of the upper half-mold 34 and the lower half-mold 23, respectively. The purpose of the peelable films 40a and 40b is to cover the surfaces of the sealing area in order to prevent direct contact of the curable silicone composition with the molding surfaces. The peelable films 40a and 40b are made of a film-like material, which can be easily peelable from cured silicone body and the mold, and possesses thermal resistance with regard to the molding temperatures, permanent mechanical strength, and sufficient softness for changing its shape in order to conform to the recesses and projections on the molding faces of the sealing area. The peelable films can be exemplified by polytetrafluoroethylene (PTFE) film, ethylene-tetrafluoroethylene copolymer (ETFE) film, tetrafluoroethylene-perfluoropropylene copolymer (FEP) film, polyvinilidenefluoride (PBDF) film, or a similar fluororesin film; polyethyleneterephthalate (PET), and polypropylene (PP).

When in the method of the invention sealing is performed only on the upper side of the printed circuit board 12, the peelable film 40a is supplied to the upper half-mold 34 for covering the surface that is to be in contact with the curable liquid silicone composition. By feeding the peelable film 40b to cover the lower half-mold 23, it is possible to use the compressibility and elasticity of the film for effectively absorbing deviations of the printed circuit board thickness from uniformity and thus to diminish non-uniformities in sealing. It should be noted, however, that the use only of the peelable film 40a that is located on the side of the upper half-mold 34 may be sufficient.

Reference numerals 42a and 42b designate feeding rolls for the peelable films 40a and 40b, and reference numerals 44a, 44b designate film-receiving rolls for the films 40a and 40b, respectively. As shown in the drawing, the film feeding rolls 42a and 42b and the film receiving rolls 44a and 44b are located on opposite sides of the molding machine. The film feeding roll 42a and the film receiving roll 44a for the upper half-mold are attached to the moveable platen 30; the film feeding roll 42b and the film receiving roll 44b for the lower half-mold 23 are attached to the stationary platen 20. With this structure, the peelable films 40a and 40b are moved through the mold from one side of the mold to the opposite side thereof. The film feeding roll 42a and the film receiving roll 44a for the upper half-mold are vertically moved together with the moveable platen 30. Reference numeral 46 designates guide rollers, and reference numeral 48 designates static-charge removers (ionizers), which remove electric charges on the peelable films 40a and 40b.

The peelable film 40a fed to the upper half-mold 34 is sucked to the molding surface and is supported on this surface due to air suction. The clamper 36 has air-suction holes 36a, which are opened in the lower end face of the clamper 36, and air-suction holes 36b, which are opened in the inner side faces of the clamper 36. The air-suction holes 36a and 36b are communicated to the air suction mechanism located outside of the mold. A seal ring (O-ring) is provided on the surface of the upper-half-mold holder 33, which is in sliding contact with the inner surface of the clamper 36. This seal ring prevents leakage of air from the air-suction holes 36b when suction is activated. An air path is formed for air that flows through the space defined between the side faces of the upper half-mold 34, side faces of the upper-half-mold holder 33, and inner faces of the clamper 36, so that the air-suction action from the air-suction hole 36b holds the peelable film 40a on the inner faces of the molding area formed by the upper half-mold 34 and the clamper 36 and fixes the film to these faces. It should be noted that the suction unit connected to the air-suction holes 36a and 36b is capable of developing not only a suction action but also of supplying compressed air. When the compressed air is fed via the aforementioned holes, the film 40a is easily peeled from the molding faces.

A method of the invention for sealing the semiconductor device with a curable silicone composition will now be explained. In FIG. 1, the side on the left from centerline CL shows an open state of the mold, in which the moveable platen 30 is in the upper position. In this state, the peelable films 40a and 40b are newly fed onto surfaces of the mold, and then the semiconductor device 16 is set in the lower half-mold 23. The semiconductor device 16 is placed onto the peelable film 40b covering the molding surface of the lower half-mold 23.

In FIG. 1, the side on the right from the center line CL shows a state, in which the peelable film 40a is sucked and fixed to the upper half-mold 34 and the lower end face of the clamper 36 by actuating the air suction unit. The peelable film 40a is fed close to the molding surface, and then the air is sucked through the air-suction holes 36a and 36b. This action attracts the peelable film 40a to the end face of the clamper 36 and fixes it to this end face. At the same time, the peelable film 40a is sucked along the inner faces of the clamper 36 and the molding face of the upper half-mold 34. As the peelable film 40a possesses sufficient softness and flexibility, it follows the shape of recesses formed on the upper half-mold 34 and the clamper 36 due to the suction action. The end face of the clamper 36 has air-suction holes 36a, which are arranged on the aforementioned face in the circumferential direction of the upper half-mold 34 with predetermined spaces from each other.

On one hand, the peelable film 40a is pressed by air suction against the upper half-mold 34, and at the same time, the curable silicone composition 50 is supplied to the printed circuit board 12 that supports the semiconductor device 16, which has been set in the lower half-mold 23. Since the amount of the curable silicone composition 50 that has to be supplied corresponds to the capacity of the sealing area, it is recommended to supply the composition in metered quantities, e.g., with the use of a dispenser.

Figure 2:
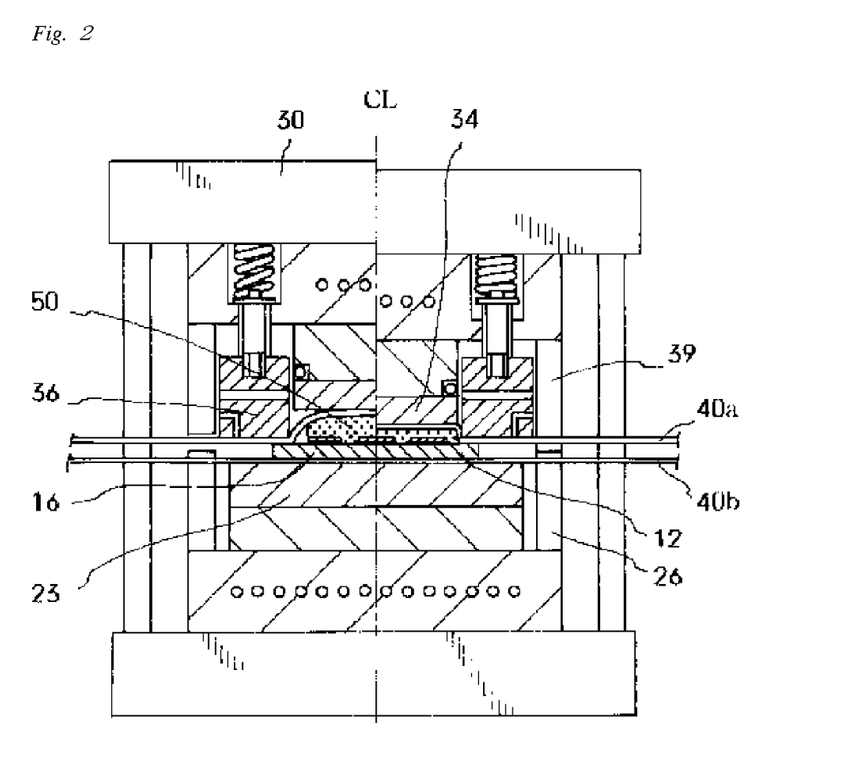
FIG. 2 is a view that illustrates position of the molding machine parts during resin sealing of the semiconductor device produced by the method of the invention.

FIG. 2 shows the mold in a closed state when the semiconductor device 16 is clamped between the lower half-mold 23 and the upper half-mold 34. A part of the mold located on the left side from the center line CL shows a state in which the upper half-mold 34 is moved downward, and the end face of the clamper 36 is pressed against the printed circuit board 12 that supports the semiconductor device 16. The upper half-mold 34 does not reach the complete lowermost position. When the sealing space is closed by the clamper 36, the curable silicone composition 50 begins to fill the sealing space and is compressed by the upper half-mold 34. In FIG. 2, a part of the mold located on the right side from the centerline CL is shown in a state in which the upper half-mold 34 is shifted downward to the clamping position. At the clamping position, the end faces of the lower clamp stoppers 26 come into contact with the end faces of the upper clamper stoppers 39. The clamping force overcomes resistance of the springs 37 and moves the clamper 36 upward, so that the curable silicone composition 50 in the sealing space can have a prescribed thickness.

When the upper half-mold 34 goes down to the clamping position and the sealing area is adjusted to a prescribed thickness, the curable silicone composition 50 completely fills the sealing area. As shown in FIG. 2, in the side of the machine on the left from the centerline CL, a small gap is formed between the corner portion of the upper half-mold 34 and the peelable film 40a. However, when the upper half-mold 34 descends to the clamping position, the gap between the upper half-mold 34 and the peelable film disappears, and the curable silicone composition 50 completely fills the sealing area.

Since the surface of the semiconductor device 16 that has to be sealed is clamped via the peelable film 40a and the periphery of the sealing area is reliably sealed by the clamper 36, the sealing operation can be carried out without leakage of the curable silicone composition from the sealing area. In the case when wire patterns are formed on the upper face of the printed circuit board 12 with minute steps, the unevenness caused by such steps can be absorbed by the peelable film 40a, so that no curable silicone composition leaks from the sealing area when the semiconductor device 16 is clamped in the mold. The lower peelable film 40b that is applied onto the lower surface of the printed circuit board 12 also absorbs, due to its resiliency in the thickness direction, the unevenness of the thickness of the semiconductor device, so that the semiconductor device can be properly sealed.

After the curable silicone composition 50 is heated and cured in the closed state of the mold, the mold is opened, and the semiconductor device sealed with a cured silicone body is removed from the mold. Since sealing was carried out between the peelable films 40a and 40b, the cured silicone body does not stick to the molding surfaces, and the peelable films 40a and 40b are easily peeled from the surfaces of the mold, so that the sealed semiconductor device can be easily extracted from the mold. As described above, separation of the peelable film 40a can be facilitated by blowing compressed air through the air-suction holes 36a and 36b. After the mold is opened, the film supply rolls 42a, 42b and the film receiving rolls 44a and 44b are activated, and the peelable films 40a and 40b are removed from the mold together with the sealed semiconductor device.

Figure 3:
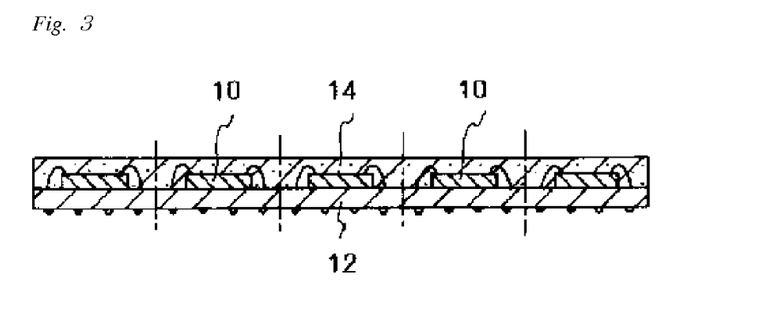
FIG. 3 is a sectional view of a semiconductor device manufactured in accordance with Application Examples of the invention.

FIG. 3 shows a semiconductor device sealed by the method of the present invention. Since the upper side of the molded portion is flat, the molding surface of the upper half-mold 34 is also flat. As shown in the drawings, the intermediate positions between the neighboring semiconductor chips 10 are intended for making a cut through the cured silicone body 14 and the printed circuit board 12 for separating the sealed semiconductor devices into individual pieces. Cutting can be made by means of a dicing saw, laser cutting device, etc. Furthermore, the molding face of the upper half-mold 34 may be provided with cavities that correspond to the mounting positions of individual semiconductor chips 10, so that each chip 10 is sealed individually in its respective cavity. A semiconductor assembly obtained by such a method can be cut into individual semiconductor devices by cutting the assembly through the center lines between the neighboring semiconductor chips.

The curable silicone composition suitable for the present invention comprises at least the following components: (A) an epoxy-containing silicone and (B) a curing agent for an epoxy resin. The aforementioned component (A) is characterized by containing an epoxy group and may be represented by (A₁) an organopolysiloxane of the following average unit formula:

$(R^1_3SiO_{1/2})_a(R^2_2SiO_{2/2})_b(R^3SiO_{3/2})_c$.

In the formula, $R^1$, $R^2$, and $R^3$ are the same or different and designate optionally substituted univalent hydrocarbon groups or epoxy-containing univalent hydrocarbon groups. The univalent hydrocarbon groups can be exemplified by methyl, ethyl, propyl, butyl, pentyl, or a similar alkyl group; vinyl, allyl, butenyl, pentenyl, hexenyl, or a similar alkenyl group; phenyl, tolyl, xylyl, or a similar aryl group; benzyl, phenethyl, or a similar aralkyl group; chloromethyl, 3,3,3-trifluoropropyl, or a similar halogenated substituted alkyl group. Most preferable are alkyl and aryl groups, especially methyl and phenyl groups. The epoxy-containing univalent organic groups can be exemplified by 2-glycidoxyethyl, 3-glycidoxypropyl, 4-glycidoxybutyl, or similar glycidoxyalkyl groups; 2-(3,4-epoxycyclohexyl)ethyl, 3-(3,4-epoxycyclohexyl)propyl, 2-(3,4-epoxy-3-methylcyclohexyl)-2-methylethyl, or similar epoxycycloalkyl alkyl groups; 4-oxyranylbutyl, 8-oxyranyloctyl, or similar oxyranylalkyl groups. Most preferable are glycidoxyalkyl and epoxycycloalkyl alkyl groups, especially 3-glycidoxypropyl and 2-(3,4-epoxycyclohexyl)ethyl groups.

Furthermore, in the above formula, 20 mole % or more, preferably 50 mole % or more, and most preferably 80 mole % or more of $R^3$'s should be aryl groups. If the content of aryl groups in $R^3$'s is below the lower recommended limit, this will either impair adhesive characteristics or decrease mechanical strength of a cured silicone body. Phenyl groups are most preferable aryl groups designated by $R^3$.

In the above formula, "a", "b", and "c" are numbers which satisfy the following conditions: $0 \le a \le 0.8$; $0 \le b \le 0.8$; $0.2 \le c \le 0.9$; and $(a+b+c)=1$. In the above unit formula of substituent (A₁), "a" is a number that shows a rate of siloxane units represented by the formula: $R^1_3SiO_{1/2}$, but when the aforementioned constituent consists only of siloxane units represented by the formula: $R^3SiO_{3/2}$, then for improving viscosity, and for deteriorating handlability and workability of the composition, it is recommended to provide "a" in the range of 0<a≤0.8 and preferably 0.3≤a≤0.8. In the above unit formula of constituent ($A_1$), "b" is a number that shows a rate of siloxane units represented by the formula: $R^2_2SiO_{2/2}$, but for preventing soaking of the present component to the surface of the cured silicone body and for providing the cured silicone body with excellent mechanical strength at an appropriate molecular weight, it is recommended to maintain "b" in the range of 0≤b≤0.6. In the above unit formula of ($A_1$), "c" is a number that shows a rate of siloxane units represented by the formula: $R^3SiO_{3/2}$, but for improving handlability and workability of the composition, and for improving adhesive properties of the cured body, mechanical properties, and flexibility of the cured body, it is recommended to provide "c" in the range of 0.4≤c≤0.9.

It is required that constituent ($A_1$) contains in one molecule at least two epoxy-containing univalent organic groups. Although there are no special restrictions with regard to the amount of the epoxy-containing univalent organic groups contained in constituent ($A_1$), it is recommended that an epoxy-equivalent number of the aforementioned component (i.e., a number that is obtained by dividing the mass-average molecular weight of the aforementioned component by the number of epoxy group contained in one molecule) be in the range of 100 to 2,000, preferably 100 to 1,000, and more preferably, 100 to 700. If the aforementioned epoxy-equivalent number is below the recommended lower limit, this will lead to decrease in flexibility of the obtained cured silicone body. If, on the other hand, the epoxy-equivalent number exceeds the recommended upper limit, this will either reduce curability of the composition, or mechanical strength and adhesive characteristics of the cured silicone body. Constituent ($A_1$) may consist of an organopolysiloxane of one type, or may be combined from organopolysiloxanes of two or more types. There are no special restrictions with regard to the state of constituent ($A_1$) at 25° C. For example, when constituent ($A_1$) is in a solid state, it can be liquefied for uniformly mixing with other components by using a solvent or by heating. From the viewpoint of better miscibility with other components and improved handlability, it is preferable to have constituent ($A_1$) in a liquid form at 25° C. Also, there are no special restrictions with regard to mass-average molecular weight of constituent ($A_1$). It is recommended, however, to provide mass-average molecular weight in the range of 500 to 10,000, preferably 750 to 3,000.

Aforementioned constituent ($A_1$) can be exemplified by compounds represented by the formulae given below, where "a", "b", and "c" have the same meanings as defined above, but "a" and "b" cannot be 0. Furthermore, "c'" and "c''" are numbers which satisfy the following conditions: 0.1<c'<0.8; 0<c''<0.2; 0.2≤(c'+c'')≤0.9; and 0.2≤c'/(c'+c''); "G" designates a 3-glycidoxypropyl group, and "E" designates a 2-(3,4-epoxycyclohexyl)ethyl group.

$[G(CH_3)_2SiO_{1/2}]_a[C_6H_5SiO_{3/2}]_c$
$[E(CH_3)_2SiO_{1/2}]_a[C_6H_5SiO_{3/2}]_c$
$[G(CH_3)_2SiO_{1/2}]_a[(CH_3)_2SiO_{2/2}]_b[C_6H_5SiO_{3/2}]_c$
$[E(CH_3)_2SiO_{1/2}]_a[(CH_3)_2SiO_{2/2}]_b[C_6H_5SiO_{3/2}]_c$
$[GCH_3SiO_{2/2}]_b[C_6H_5SiO_{3/2}]_c$
$[ECH_3SiO_{2/2}]_b[C_6H_5SiO_{3/2}]_c$
$[G(CH_3)_2SiO_{1/2}]_a[C_6H_5SiO_{3/2}]_{c'}[CH_3SiO_{3/2}]_{c''}$
$[E(CH_3)_2SiO_{1/2}]_a[C_6H_5SiO_{3/2}]_{c'}[CH_3SiO_{3/2}]_{c''}$
$[C_6H_5SiO_{3/2}]_{c'}[GSiO_{3/2}]_{c''}$
$[C_6H_5SiO_{3/2}]_{c'}[ESiO_{3/2}]_{c''}$

There are no special restrictions with regard to methods suitable for the preparation of constituent ($A_1$). For example, such a method may consist of co-hydrolysis and condensation of a phenyltrialkoxysilane and an alkoxysilane with epoxy-containing univalent organic groups, e.g., a 3-glycidoxypropyl-trimethoxysilane or 2-(3,4-epoxycyclohexyl)ethyltri-methoxysilane. Alternatively, the method may consist of dealcoholation and condensation of the aforementioned alkoxysilane having epoxy-containing univalent organic group and an organopolysiloxane with silanol groups obtained by hydrolysis and condensation of a phenyltrichlorosilane or phenyltrialkoxysilane. Another method may consist of hydrosilylation of an olefin having an epoxy-containing univalent organic groups and an organopolysiloxane having silicon-bonded hydrogen atoms prepared by cohydrolysis and condensation of a phenyltrichlorosilane or a phenyltrialkoxysilane in the presence of a dimethylchlorosilane, or a similar silane having hydrogen-bonded hydrogen atoms. The following methods are also possible: carrying out an equilibrium reaction in the presence of a basic catalyst between an organopolysiloxane prepared by cohydrolysis and condensation of a phenyltrichlorosilane or a phenyltrialkoxysilane and a copolymer of a dimethylsiloxane and a methyl (3-glycidoxypropyl) siloxane capped at both molecular terminals with trimethylsiloxy groups or a copolymer of a dimethylsiloxane and a methyl {2-(3,4-epoxycyclohexyl) ethyl}siloxane capped at both molecular terminals with trimethoxysilyl groups; carrying out an equilibrium reaction in the presence of a basic catalyst between an organopolysiloxane composed of siloxane units represented by formula $C_6H_5SiO_{3/2}$ and a cyclic methyl (3-glycidoxypropyl) siloxane or a cyclic methyl {2-(3,4-epoxycyclohexyl) ethyl}siloxane; and carrying out an equilibrium reaction in the presence of a basic or acidic catalyst between an organopolysiloxane composed of siloxane units represented by formula $C_6H_5SiO_{3/2}$, a cyclic methyl (3-glycidoxypropyl) siloxane or a cyclic methyl {2-(3,4-epoxycyclohexyl) ethyl}siloxane, and a cyclic dimethylsiloxane.

Component (A) may also be represented by ($A_2$) a diorganopolysiloxane of the following general formula:

$$A-R^5-(R^4_2SiO)_mR^4_2Si-R^5-A.$$

In the formula, $R^4$ designates an optionally substituted univalent hydrocarbon group which is free of unsaturated aliphatic bonds. Specific examples of such a group are the following: methyl, ethyl, propyl, butyl, pentyl, hexyl, or similar alkyl groups; cyclopentyl, cyclohexyl, cycloheptyl, or similar cycloalkyl groups; phenyl, tolyl, xylyl, or similar aryl groups; benzyl, phenethyl, phenylpropyl, or similar aralkyl groups; 3-chloropropyl, 3,3,3-trifluoropropyl, or similar halogenated alkyl groups. Most preferable are alkyl groups, especially methyl groups. In the above formula, $R^5$ designates a bivalent organic group. This group may be exemplified by ethylene, methylethylene, propylene, pentylene, hexylene or similar alkylene groups; ethylenoxyethylene, ethylenoxypropylene, ethylenoxybutylene, propylenoxypropylene, or similar alkylenoxyalkylene groups. Most preferable are alkylene groups, especially ethylene groups. In the above formula, "m" is a an integer equal to or greater than 1. This number represents the degree of polymerization of the diorganopolysiloxane that constitutes the main chain of the molecule. From the viewpoint of improved flexibility of the obtained cured silicone body, it is recommended to have "m" equal to or greater than 10. Although there are no special restrictions with regard to the upper limit of "m", it is recommended not to exceed 500.

In the above formula, "A" is a siloxane residual radical represented by the following average unit formula:

$$(XR^4_2SiO_{1/2})_d(SiO_{4/2})_e.$$

In the formula, $R^4$ designates optionally substituted univalent hydrocarbon groups which are free of unsaturated aliphatic bonds. These groups may be exemplified by the same groups as above, preferable of which are alkyl groups, especially methyl groups. Furthermore, in the above formula, "X" designates a single bond for bonding to aforementioned $R^5$, hydrogen atom, a group represented by aforementioned $R^1$, an epoxy-containing univalent organic group, or an alkoxysilylalkyl group. Groups designated by $R^4$ may be exemplified by the same groups as given above. For example, the epoxy-containing organic group may be represented by 2-glycidoxyethyl, 3-glycidoxypropyl, 4-glycidoxybutyl, or similar glycidoxyalkyl groups; 2-(3,4-epoxycyclohexyl)ethyl, 3-(3,4-epoxycyclohexyl) propyl, or a similar 3,4-epoxycyclohexyl alkyl group; 4-oxyranylbutyl, 8-oxyranyloctyl, or a similar oxyranylalkyl group. The alkoxysilylalkyl group can be represented by a trimethoxysilylethyl, trimethoxysilylpropyl, dimethoxymethylsilylpropyl, methoxydimethylsilylpropyl, triethoxysilylethyl, or a tripropoxysilylpropyl group. In one molecule, at least one "X" must be a single bond for bonding to $R^5$ in the aforementioned diorganopolysiloxane. At least two X's in one molecule must be epoxy-containing univalent organic groups. Preferable are glycidoxyalkyl groups, especially 3-glycidoxypropyl groups. In the above formula, "d" is a positive number, "e" is a positive number, and "d/e" is a positive number in the range of 0.2 to 4.

There are no special restrictions with regard to molecular weight of constituent ($A_2$) but it is recommended to have mass-average molecular weight in the range of 500 to 1,000,000. Also, there are no restrictions with regard to the state of constituent ($A_2$) at 25° C. For example, this component can be liquid with viscosity in the range of 50 to 1,000,000 mPa·s. The diorganopolysiloxane of constituent ($A_2$) can be manufacture by a method described, e.g., in Kokai H06-56999.

The composition of the invention may contain constituent ($A_1$) or constituent ($A_2$), or a mixture of constituents ($A_1$) and ($A_2$), but the use at least of constituent ($A_2$) is also possible. In particular, component (A) may comprise constituent ($A_2$) alone or in a mixture with constituent ($A_1$). There are no special restrictions with regard to the constituent ($A_2$) when component (A) is a mixture of constituents ($A_1$) an ($A_2$) but it is recommended to use constituent ($A_2$) in an amount of 0.1 to 800, preferably 1 to 500, and most preferably 10 to 200 parts by mass per 100 parts by mass of constituent ($A_1$). If the content of constituent ($A_2$) is below the recommended lower limit of the above ranger, this will lead to decrease in flexibility of the obtained cured silicone body. If, on the other hand, the content constituent ($A_2$) exceeds the recommended upper limit of the range, this will increase viscosity of the obtained composition.

The curing agent (B) for an epoxy resin is a component that enters into reaction with epoxy groups of component (A) and is used for curing the composition. This component is represented by a compound that preferably contains in one molecule two or more functional groups reactive to the epoxy group. Specific examples of the aforementioned functional groups are the following: primary amino groups, secondary amino groups, hydroxyl groups, phenolic hydroxyl groups, carboxylic acid groups, acid anhydride groups, mercapto groups, and silanol groups, Most preferable from the viewpoint of better reactivity and pot life are phenolic hydroxyl groups. In other words, preferable component (B) is a compound that contains phenolic hydroxyl groups. Specific examples of such compounds are the following: phenol novolac resins, cresol novolac resins, bisphenol-A type compounds, or similar phenol resins; and organosiloxanes that contain phenolic hydroxyl groups. Preferable are compounds with a phenolic hydroxyl group number (which is a number obtained by dividing mass-average molecular weight of the present component by the number of phenolic hydroxyl groups contained in one molecule) not exceeding 1,000. From the viewpoint of improved reactivity, this number should not exceed 500.

In order to improve flexibility of the obtained cured silicone body, the organosiloxane with phenolic hydroxyl groups used in component (B) should be one represented by the following general formula:

In the formula, $R^6$ may be the same or different optionally substituted univalent hydrocarbon groups or univalent organic groups that contain phenolic hydroxyl groups. The univalent hydrocarbon groups may be the same as defined above, of which alkyl and aryl groups are preferable, and of which methyl and phenyl groups are most preferable. The organic groups that contain phenolic hydroxyl groups are exemplified by groups given below. In the formulae of these groups, $R^7$ designates bivalent organic groups. Specific examples of the aforementioned organic groups are the following: ethylene, methylethylene, propylene, butylenes, pentylene, hexylene, or similar alkylene groups; ethylenoxyethylene, ethylenoxypropylene, ethylenoxybutylene, propylenoxypropylene, or similar alkylenoxyalkylene groups. Preferable are alkylene groups, and most preferable are propylene groups.

In the formula of the organosiloxane, "n" is an integer from 0 to 1,000, preferably 0 to 100, and most preferable 0 to 20. If this number is below the recommended lower limit, this will impair handlability of this component and miscibility thereof with component (A).

Examples of organosiloxanes that can be used as component (B) are given below. In the following formulae, "x" is an integer between 1 and 20, and "y" is an integer between 2 and 10.

There are no special restrictions with regard to the method of preparation of component (B). For example, this component can be prepared by hydrosilylation of an alkenyl-containing phenol compound and an organopolysiloxane that contains silicon-bonded hydrogen atoms.

There are no special restrictions with regard to the state of component (B) at 25° C., and this component can be liquid or solid. The liquid state is preferable as it facilitates handling. When component (B) is liquid at 25° C., it should have viscosity in the range of 1 to 1,000,000 mPa·s, preferably in the range of 10 to 5,000 mPa·s. If viscosity of component (B) at 25° C. is below the recommended lower limit, this will impair mechanical strength of the cured silicone body. If, on the other hand, viscosity exceeds the recommended upper limit, this will impair handling conditions of the obtained curable silicone composition.

There are no special restrictions with regard to the amount in which component (B) can be used. However, the preferable amount of component (B) in the composition may be used in the range of 0.1 to 500 parts by mass, preferably 0.1 to 200 parts by mass per 100 parts by mass of component (A). When component (B) contains phenolic hydroxyl groups, the preferable mole ratio of phenolic hydroxyl groups in component (B) to all epoxy groups of the composition may be in the range of 0.2 to 5, preferably 0.3 to 2.5, and most preferably 0.8 to 1.5. If the aforementioned mole ratio of phenolic hydroxyl groups in component (B) to all epoxy groups of the composition is below the recommended lower limit, this will impair conditions for curing the obtained curable silicone composition. If, on the other hand, the mole ratio exceeds the recommended upper limit, this will impair mechanical properties of the obtained cured silicone body.

The above composition may contain (C) a curing accelerator as an arbitrary component. Such a component can be exemplified by tertiary amine compounds; organoaluminum compounds, organozirconium compounds, or similar organometallic compounds; a phosphine, or similar organophosphorus compounds; as well by heterocyclic amine compounds; boron complex compounds; organic ammonium salts; organic sulfonium salts; organic peroxides; or reaction products of the above compounds. For example, such a compound can be a triphenylphosphine, tributylphosphine, tri(p-methylphenyl) phosphine, tri(nonylphenyl) phosphine, triphenylphosphine-triphenylborate, tetraphenylphosphine-tetraphenylborate, or similar phosphorus type compounds; triethylamine, benzyldimethylamine, α-methylbenzyldimethylamine, 1,8-diazabicyclo[5.4.0]undecene-7, or similar tertiary amine compounds; 2-methylimidazole, 2-phenylimadazole, 2-phenyl-4-methylimidazole, or similar imidazole compounds. In order to extend service life of the compound, it is recommended to use the aforementioned curing accelerator in an encapsulated form. An encapsulated curing accelerator is commercially produced as an encapsulated amine type curing accelerator made from a bisphenol-A type epoxy resin that contains an amine-type curing accelerator (HX-3088 produced by Asahi Kasei Co., Ltd.).

There are no special restrictions with regard to the amount in which component (C) can be used in the composition of the invention. However, it is recommended to use component (C) in an amount not exceeding 50 parts by mass, preferably 0.01 to 50 parts by mass, and most preferably 0.1 to 5 parts by mass, per 100 parts by mass of component (A).

In order to improve mechanical strength of a cured body of the silicone composition, the composition may be combined with (D) a filler. Such a filler may be represented by glass fiber, alumina fiber, ceramic fiber made from alumina and silica, boron fiber, zirconia fiber, silicon carbide fiber, metal fiber, or a similar fibrous filler; fused silica, crystalline silica, precipitated silica, fumed silica, baked silica, zinc oxide, burned clay, carbon black, glass beads, alumina, talc, calcium carbonate, clay, aluminum hydroxide, magnesium hydroxide, barium sulfate, aluminum nitride, boron nitride, silicon carbide, magnesia, titania, beryllium oxide, kaolin, mica, zirconia, or similar inorganic fillers; fine-metal powders of gold, silver, copper, aluminum, nickel, palladium, as well as alloys, brasses, shape-memory alloys, or solders of the aforementioned metals; gold, silver, nickel, copper or other metals vapor-deposited or deposited via metallization onto the surfaces of finally powdered ceramic, glass, quartz, organic resin, etc.; the above fillers can be used separately or in combinations of two or more. Preferable are alumina, crystalline silica, aluminum nitride, boron nitride, or other powders with thermoconductive properties, fused silica, precipitated silica, fumed silica, colloidal silica, or similar filler powders with reinforcing properties. In order to impart to the obtained cured silicone body heat-conductive and electrically conductive properties, it is recommended that a silver powder be used. Furthermore, in order to impart to the cured silicone body primarily heat-conductive properties, it is recommended that an alumina powder be used. The powder particles may have the form of crushed powder particles, as well as various shapes such as spherical, fibrous, columnar, flake-like, scale-like, plate-like, or coil-like. There are no special restrictions with regard to the size of the particles; however, usually the maximum size should not exceed 200 μm, and an average size should be in the range of 0.001 to 50 μm.

Also, there are no restrictions with regard to the amount in which component (D) can be used in the composition of the invention; however, it is recommended to use this component in an amount not to exceed 5,000 parts by mass, preferably in the range of 10 to 4,000 parts by mass, and most preferably in the range of 50 to 4,000 parts by mass per 100 parts by mass of component (A). If other fillers are used in addition to the aforementioned fine-metal powders and heat-conductive powders, then the content of component (D) should not exceed 2,000 parts by mass, preferably should be in the range of 10 to 2,000 parts by mass, and most preferably in the range of 50 to 1,000 parts by mass per 100 parts by mass of component (A). When particles of the aforementioned filler have a plate-like or scale-like shape, then it is possible to obtain a cured silicone body with a curing shrinkage rate reduced in a specific direction.

If it is necessary to improve curing properties and workability in the obtained curable silicone composition or to improve adhesive properties and modulus of elasticity in a cured body obtained by curing the composition, the composition may additionally contain (E) an organic epoxy compound. There are no special restrictions with regard to the state of component (E) at 25° C., and this component can be in a liquid or solid state, the liquid state of which is preferable. Aforementioned component (E) is exemplified by bisphenol-A epoxy resin, bisphenol-F epoxy resin, and alicyclic epoxy resin. There are no special restrictions with regard to the amount in which component (E) can be used, but it is recommended that this component be added in an amount not to exceed 500 parts by mass, preferably in the range of 0.1 to 500 parts by mass per 100 parts by mass of component (A).

Furthermore, in order to improve the dispersion of component (D) in component (A) or to improve the adhesion of a cured silicone body to a semiconductor chip or circuit board, the composition may contain (F) a coupling agent. Such a coupling agent may comprise a titanate coupling agent, silane coupling agent, or the like. The titanate coupling agent is exemplified by i-propoxytitanate-tri(isostearate). The silane coupling agent is exemplified by 3-glicycloxypropyltrimethoxysilane, 3-glicycloxypropylmethyl-diethoxysilane, 2-(3,4-epoxycyclohexyl)ethyltrimethoxysilane, or similar epoxy-containing alkoxysilanes; N-(2-aminoethyl)-3-aminopropyltrimethoxysilane, 3-aminopropyltriethoxysilane, N-phenyl-3-aminopropyltrimethoxysilane, or similar amino-containing alkoxysilanes; and 3-mercaptopropyltrimethoxysilane, or similar mercapto-containing alkoxysilanes. There are no special restrictions with regard to the amount in which component (F) can be used; however, it is recommended to add this component in an amount not exceeding 10 parts by mass, preferably in the range of 0.01 to 10 parts by mass per 100 parts by mass of component (A).

If necessary, the composition of the invention can be combined with other arbitrary components such as tetramethoxysilane, tetraethoxysilane, dimethyldimethoxysilane, methylphenyldimethoxysilane, methylphenyldiethoxysilane, phenyltrimethoxysilane, methyltrimethoxysilane, methyltriethoxysilane, vinyltrimethoxysilane, allyltrimethoxysilane, allyltriethoxysilane, or similar alkoxysilanes.

The composition of the invention is prepared by mixing components (A) and (B), and, if necessary, with the addition of other components. There are no special restrictions with regard to the method used for mixing the aforementioned components, and the following methods are possible: (1) components (A) and (B) and, if necessary, other components, are mixed simultaneously and altogether; (2) components (A) and (B) are premixed and then are mixed with the arbitrary components. There are no special restrictions with regard to equipment that can be used for mixing the components. For example, equipment may comprise a single-shaft or double-shaft continuous mixer, two-roll mill, Ross Mixer®, Hobart mixer, dental mixer, planetary mixer, kneader mixer, etc.

In addition to the fact that the curable silicone composition used in the method of the invention protects the semiconductor chips and their wiring from damage, the cured body of the composition also functions as an electrical insulation layer for the semiconductor chips and the circuit board or as a buffer layer for the aforementioned parts. There are no special restrictions with regard to the form of the cured silicone body, and the latter may be in the form of rubber, hard rubber, or resin, preferably with the composite modulus of elasticity not exceeding 2 GPa.

A semiconductor device suitable for sealing with a cured silicone body by the method of the invention may comprise semiconductor chips placed onto a circuit board, semiconductor chips with preliminary electrical connections to a circuit board, or a semiconductor wafer preliminarily cut into individual semiconductor elements. FIG. 3 illustrates a semiconductor device wherein the semiconductor chips and circuit board, as well as the semiconductor chips with a plurality of lead wires and the circuit board, are wire-bonded. In the manufacture of the semiconductor device shown in FIG. 3, semiconductor chips 10 are initially placed onto a printed circuit board 12 made from a polyamide resin, epoxy resin, BT resin, or ceramic, and then are wire-bonded by means of bonding wires made from gold or aluminum to the printed circuit board 12. In semiconductor devices of other types, semiconductor chips can be electrically connected to a circuit board by means of solder balls or conductive bumps. In order to reinforce the solder balls or conductive bumps, they can be sealed by means of an underfill agent. Such an agent may comprise a curable epoxy resin composition or a curable silicone composition. The semiconductor device shown in FIG. 3 contains external electrodes such as solder balls, which after completion of the sealing operation, are formed on the lower surface of the printed circuit board 12 which supports the semiconductor chips 10. This is done to connect the semiconductor device with other circuit boards. When all semiconductor chips placed onto the circuit board are sealed simultaneously, the package can be cut into individual semiconductor devices by sawing or stamping out.

When in the method of the invention the semiconductor device is sealed in a cured body of silicone by using the compression-molding machine described above and when the curable silicone composition is in direct contact with the molding surface that may have unevenness which can be transferred to the surface of the product, it is recommended to perform compression molding through the above-described peelable film. When peelable film is used and sealing is carried out in a continuous mode, this makes it possible to extend intervals between the mold-cleaning operations and thus to improve production efficiency.

There are no special restrictions with regard to the compression-molding conditions in the method of the invention, but in order to reduce stress that may be caused in the material of the circuit board and in the semiconductor chips, it is recommended to conduct heat treatment at a temperature in the range of 60° C. to 130° C. Furthermore, the compression-molding cycle time can be shortened by preheating the mold. Curable silicone compositions of different types can be used, but better conditions for controlling spreading properties of the curable silicone composition can be achieved when the composition is preliminarily applied dropwise onto the circuit board which is heated by the residual heat of the lower half-mold.

The following description relates to the semiconductor device of the invention. The semiconductor device of the invention is characterized by being manufactured according to the above-described method of the invention. Since such a semiconductor device is free of voids in the material of the sealing resin, the product is free of external defects and has good moisture-resistance properties. Furthermore, since the semiconductor devices of the invention are manufactured with precision control of thickness in the sealing resin, such semiconductor devices are suitable for use in miniature and thin electronic devices.

EXAMPLES

The method of the invention for manufacturing semiconductor devices and semiconductors, per se, will now be described in more detail with reference to Application and Comparative Examples. In these Examples, the mass-average molecular weights were measured by gel-permeation chro- matography with the use of toluene as a solvent and are given in values referenced to polystyrene as the standard.

Reference Example 1

A curable silicone composition was prepared by mixing the following components: 31.0 parts by mass of a dimethylpolysiloxane represented by the following formula:

{where X is a siloxane residual radical represented by the following average unit formula:

(where G is a 3-glycidoxypropyl group)} (where mass-average molecular weight of the aforementioned dimethylpolysiloxane is 36,000; viscosity is 4,720 mPa·s; and the epoxy equivalent is 360); 14.0 parts by mass of an organotrisiloxane of the following formula:

(where viscosity is 3,800 mPa·s and the phenolic hydroxyl equivalent group number is 317); 10.0 parts by mass of the encapsulated amine-type curing accelerator comprising a mixture of bisphenol-A epoxy resin with 40 mass % of an amine-type curing accelerator (HX-3721 produced by Asahi Kasei Co., Ltd.); 60.0 parts by mass of spherical fine amorphous silica powder (Admafine produced by Admatechs Co., Ltd.; average diameter of particles is 1.5 μm); and 1 part by mass of 3-glycidoxypropyltrimethoxysilane. The obtained curable silicone composition was checked with regard to viscosity, composite modulus of elasticity of the cured silicone body obtained by curing the aforementioned curable silicone composition, adhesive properties, and buckling. The results are shown in Table 1.

[Viscosity]

Viscosity of the curable silicone composition at 25° C. was measured by means of an E-type viscometer (Digital Viscometer Model DV-U-E, Type II produced by Tokimec Inc.), speed of rotation 2.5 rpm.

[Composite Modulus of Elasticity]

After the curable resin composition was defoamed at 70 mmHg, it was loaded into a mold having a 10 mm-wide, 50 mm-long, and 2 mm-deep cavity, and after pressure curing for 60 min. under conditions of 150° C. and 2.5 MPa was completed, the obtained cured specimen was subjected to secondary heat treatment for 2 hours in an oven at 180° C. The composite modulus of elasticity of the obtained specimen at 25° C. was measured with the use of the ARES viscoelasticity tester (Model RDA 700 produced by Rheometric Scientific Co.). Measurement was carried out under the following conditions: twist 0.05%; frequency 1 Hz.

[Adhesive Properties]

The curable silicone composition was applied in an amount of about 1 cm³ onto an adherend {a glass plate (a float glass plate produced by Paltec Co., Ltd.); a nickel plate (SPCC-SB produced by Paltec Co., Ltd.); a copper plate (C1100P produced by Paltec Co., Ltd.); an aluminum plate (A1050P produced by Paltec Co., Ltd); and a gold-plated plate (C2801P produced by Nippon Test Panel Co.)}. The units were heated in an oven for 2 hours at 125° C. and then in an oven for another 2 hours at 180° C. As a result, specimens for evaluating adhesive properties were produced. The cured coatings were separated from the specimens by means of a tantalum spatula, and the separation conditions were designated as follows:

CF: separation with fracture of the coating material

TCF: separation with a thin residual layer left on the interface; and

AF: complete separation through interface.

[Buckling]

A mold (10 mm wide×50 mm long×1 mm deep) was placed onto a polyamide film (Upilex 125S produced by Ube Industries Co., Ltd.; thickness=125 μm), the mold was filled with a curable silicone composition, and then a Teflon® sheet was applied, and the unit was subjected to pressure-molding during 10 min. at 110° C. Following this, a cured silicone body in a semicured state attached to the polyamide film was removed from the mold and subjected to post-curing for 2 hours in an oven with circulation of hot air at 180° C. The unit was cooled to room temperature, and buckling of the polyamide film was measured by the following method. The polyamide film was placed onto a flat table, one short side of the rectangular plate was fixed to the table, and the distance from the table to two end points of the opposite side was measured by a caliper. An average value of two measurements was used as a criterion for evaluation of buckling.

Reference Example 2

A curable silicone composition was prepared by mixing the following components: 20.0 parts by mass of a dimethylpolysiloxane represented by the following formula:

{where X is a siloxane residual radical represented by the following average unit formula:

(where G is a 3-glycidoxypropyl group)} (where mass-average molecular weight of the aforementioned dimethylpolysiloxane is 78,000; viscosity is 22,000 mPa·s; and the epoxy equivalent is 450); 8.0 parts by mass of a bisphenol A-type liquid epoxy resin (Epikote 828 produced by Japan Epoxy Resin Company; epoxy equivalent=190); 23.0 parts by mass of an organotrisiloxane of the following formula:

(where viscosity is 2,600 mPa·s and the phenolic hydroxyl equivalent group number is 330); 5.0 parts by mass of the encapsulated amine-type curing accelerator comprising a mixture of bisphenol-A epoxy resin with 35 mass % of an amine-type curing accelerator (HXA-4921HP produced by Asahi Kasei Co., Ltd.); 4 parts by mass of a fine dry silica powder (average diameter of primary particles is 7 to 16 nm); and 40.0 parts by mass of a spherical fine amorphous silica powder (Admafine produced by Admatechs Co., Ltd.; average diameter of particles is 1.5 μm). The properties of the obtained curable silicone composition and characteristics of the cured body obtained from the composition were evaluated by the same methods as in Reference Example 1. The results are shown in Table 1.

Reference Example 3

A curable silicone composition was prepared by mixing the following components: 8.9 parts by mass of an organopolysiloxane represented by the following average unit formula:

(mass-average molecular weight=1,000; viscosity=1.290 mPa·s; epoxy equivalent=267); 10.0 parts by mass of a dimethylpolysiloxane represented by the following formula:

{where X is a siloxane residual radical represented by the following average unit formula:

(where G is a 3-glycidoxypropyl group)} (where mass-average molecular weight of the aforementioned dimethylpolysiloxane is 78,000; viscosity is 22,000 mPa·s; and the epoxy equivalent is 450); 19.0 parts by mass of an organotrisiloxane of the following formula:

(where viscosity is 2,600 mPa·s and the phenolic hydroxyl equivalent group number is 330; and where the mole ratio of phenolic hydroxyl groups of the present component to epoxy groups of the composition is equal to 1.0); 0.1 parts of carbon black (Denka Black produced by Denki Kagaku Kogyo Co.); 1.0 part by mass of the encapsulated amine-type curing accelerator comprising a mixture of bisphenol-A epoxy resin with 35 mass % of an amine-type curing accelerator (HXA-4921 HP produced by Asahi Kasei Co., Ltd.); 54.0 parts by mass of spherical amorphous silica powder (the product of Denki Kagaku Kogyo, Co.; average diameter of particles is 3.3 μm); 6.0 parts by mass of a spherical amorphous silica powder (the product of Denki Kagaku Kogyo Co.; average diameter of particles is 0.3 μm); and 1 part by mass of 3-glycidoxypropyltrimethoxysilane. The properties of the obtained curable silicone composition and characteristics of the cured body obtained from the composition were evaluated by the same methods as in Reference Example 1. The results are shown in Table 1.

Reference Example 4

A curable silicone composition was prepared by mixing the following components: 13.0 parts by mass of an organopolysiloxane represented by the following average unit formula:

(mass-average molecular weight=1,000; viscosity=1,290 mPa·s; epoxy equivalent=267); 6.0 parts by mass of a dimethylpolysiloxane represented by the following formula:

{where X is a siloxane residual radical represented by the following average unit formula:

(where G is a 3-glycidoxypropyl group)} (where mass-average molecular weight of the aforementioned dimethylpolysiloxane is 78,000; viscosity is 22,000 mPa·s; and the epoxy equivalent is 450); 16.0 parts by mass of an organotrisiloxane of the following formula:

(where viscosity is 2600 mPa·s and the phenolic hydroxyl equivalent group number is 330); 49.0 parts by mass of spherical fine amorphous silica powder (the product of Denki Kagaku Kogyo Co.; average diameter of particles is 3.3 µm); 5.0 parts by mass of spherical fine amorphous silica powder (the product of Denki Kagaku Kogyo, Co.; average diameter of particles is 0.3 µm); 1.0 part by mass of the encapsulated amine-type curing accelerator comprising a mixture of bisphenol-A epoxy resin with 40 mass % of an amine-type curing accelerator (HX-3721 produced by Asahi Kasei Co., Ltd.); and 10.0 parts by mass of columnar crystalline barium sulfate powder (B-30 produced by Sakai Chemical Industries Co., Ltd.). The properties of the obtained curable silicone composition and characteristics of the cured body obtained from the composition were evaluated by the same methods as in Reference Example 1. The results are shown in Table 1.

Reference Example 5

A curable silicone composition was prepared by mixing the following components: 12.0 parts by mass of a dimethylpolysiloxane represented by the following formula:

{where X is a siloxane residual radical represented by the following average unit formula:

(where G is a 3-glycidoxypropyl group)} (where mass-average molecular weight of the aforementioned dimethylpolysiloxane is 78,000; viscosity is 22,000 mPa·s; and the epoxy equivalent is 450); 1.0 part by mass of a 3-glycidoxypropyl-trimethoxysilane; 38.0 parts by mass of spherical fine amorphous silica powder (Admafine produced by Admatechs Co., Ltd.; average diameter of particles is 1.5 µm); 15.0 parts by mass of columnar crystalline barium sulfate powder (the product of Sakai Chemical Industries Co., Ltd.); 1.0 part by mass of the encapsulated amine-type curing accelerator comprising a mixture of bisphenol-A epoxy resin with 40 mass % of an amine-type curing accelerator (HX-3721 produced by Asahi Kasei Co., Ltd.); 8.0 parts by mass of scale-like glass powder (the product of Nippon Sheet Glass Co., Ltd.; average particle size=15 µm); and 15.0 parts by mass of a polydimethylsiloxane represented by the following formula:

(where viscosity is 80 mPa·s and the phenolic hydroxyl equivalent group number is 700). The properties of the obtained curable silicone composition and characteristics of the cured body obtained from the composition were evaluated by the same methods as in Reference Example 1. The results are shown in Table 1.

Reference Example 6

A curable silicone composition was prepared by mixing the following components: 4.0 parts by mass of an organopolysiloxane represented by the following average unit formula:

(mass-average molecular weight=1,000; viscosity=1,290 mPa·s; epoxy equivalent=267); 5.0 parts by mass of a dimethylpolysiloxane represented by the following formula:

{where X is a siloxane residual radical represented by the following average unit formula:

(where G is a 3-glycidoxypropyl group)} (where mass-average molecular weight of the aforementioned dimethylpolysiloxane is 78,000; viscosity is 22,000 mPa·s; and the epoxy equivalent is 450); 9.0 parts by mass of an organotrisiloxane of the following formula:

(where viscosity is 2,600 mPa·s and the phenolic hydroxyl equivalent group number is 330); 80.0 parts by mass of spherical alumina powder (the product of Micron Co.; average diameter of particles=8.0 μm); 1.5 parts by mass of the encapsulated amine-type curing accelerator comprising a mixture of bisphenol-A epoxy resin with 40 mass % of an amine-type curing accelerator (HX-3721 produced by Asahi Kasei Co., Ltd.). The properties of the obtained curable silicone composition and characteristics of the cured body obtained from the composition were evaluated by the same methods as in Reference Example 1. The results are shown in Table 1.

Reference Example 7

A curable epoxy resin composition was prepared by mixing the following components: 27.0 parts by mass of a bisphenol-A liquid epoxy resin (Epikote 828 produced by Japan Epoxy Resin Co., Ltd.; epoxy equivalent=190); 11.0 parts by mass of a liquid methylhexahydrophthalic anhydride (HN-5500 produced by Hitachi Kasei Kogyo Co., Ltd.); 1.0 part by mass of the encapsulated amine-type curing accelerator comprising a mixture of bisphenol-A epoxy resin with 40 mass % of an amine-type curing accelerator (HX-3088 produced by Asahi Kasei Co., Ltd.); 60.0 parts by mass of spherical amorphous fine silica powder (Admafine produced by Admatechs Co., Ltd.; average diameter of particles is 1.5 μm); and 1.0 part by mass of 3-glycidoxypropyltrimethoxysilane. The properties of the obtained curable epoxy resin composition and characteristics of the cured body obtained from the composition were evaluated by the same methods as in Reference Example 1. The results are shown in Table 1.

Reference Example 8

A curable silicone composition was prepared by mixing the following components: 85.3 parts by mass a dimethylpolysiloxane capped at both molecular terminals with dimethylvinylsilyl groups (viscosity=2,000 mPa·s); 1.3 parts by mass of a methylhydrogenpolysiloxane capped at both molecular terminals with trimethylsilyl groups (viscosity=50 mPa·s); a complex of platinum with 1,3-divinyl-1,1,3,3-tetramethyldisiloxane (with a content of metal platinum equal to 5 ppm in terms of mass units); and 12.3 parts by mass of fine dry silica powder (average diameter of primary particles=7 to 16 nm). Except for measuring viscosity of the curable siloxane composition with a rotation speed of 20 rpm, other properties of the obtained curable silicone composition and characteristics of a cured silicone body obtained from the composition were evaluated by the same methods as in Reference Example 1. The results are shown in Table 1.

Application Example 1

In accordance with this example, semiconductor devices shown in FIG. 3 were produced. More specifically, semiconductor chips having dimensions of 10 mm×10 mm were attached to a BT-resin circuit board having dimensions of 70 mm×160 mm (a 18 μm thick copper foil was laminated onto one side of a 200 μm thick BT-resin film via a 17 μm thick adhesive epoxy resin layer; a circuit pattern was then formed from the copper foil; portions needed for wire bonding of the pattern were removed; and the surface of the circuit board was coated with a photosensitive solder mask) through a 35 μm thick epoxy-resin agent (DIEBOND). Following this, the bumps of the semiconductor chips and the circuit pattern were electrically connected by bonding wires. Twenty seven semiconductor chips organized in three blocks, each of 9 semiconductor chips, were formed on one circuit board and then wire bonded to respective areas of the circuit pattern.

The appropriate areas of the BT resin circuit board with semiconductor chips were coated at room temperature with the curable silicone composition prepared in Reference Example 1, and the treated circuit board was placed into the lower half-mold of the compression molding machine (Apic Yamada Corporation; compression molding machine; model MZ-635-01). The upper and the lower half-molds of the compression molding machine were then closed (the upper half-mold cavity had dimensions of 40 mm×170 mm×1 mm; in order to prevent contamination of the molding surface and facilitate separation of the cured silicone body from the mold, the inner surface of the upper half-mold was coated with a peelable tetrafluoroethylene resin film that was biased to the surface of this half-mold by air suction). The circuit board was held squeezed between the half-molds and thus compression molded for 3 min. under pressure of 35 kgf/cm$^2$ at 150° C. Upon completion of the molding operation, a semiconductor device sealed in a cured body of silicone was removed from the mold and heat treated for 1 hours in an oven at 180° C. The semiconductor chips on the surface of the obtained semiconductor device were sealed with a 400 μm thick cured silicone layer. The obtained semiconductor device was evaluated with regard to appearance, warping, and scratch-resistant properties by the methods described below. The results are shown in Table 2.

[Appearance]

In evaluation of the appearance of a semiconductor device sealed with a cured body of silicone, those coatings that had less than 5% deviation in thickness between the central part and the peripheral portions were designated by symbol 0; the coatings having the aforementioned deviation in the range of

TABLE 1

| Characteristics | | Examples Reference Example No. | | | | | | | |
|---|---|---|---|---|---|---|---|---|---|
| | | 1 | 2 | 3 | 4 | 5 | 6 | 7 | 8 |
| Viscosity (Pa · s) | | 140 | 480 | 100 | 120 | 50 | 250 | 18 | 3* |
| Composite Modulus of Elasticity (MPa) | | 730 | 350 | 50 | 70 | 50 | 1700 | 2470 | 0.4 |
| Warping (mm) | | 5 | 12 | 4 | 4 | 5 | 10 | 17 | 7 |
| Adhesive Properties | Glass Plate | CF | CF | CF | CF | CF | CF | CF | CF |
| | Nickel Plate | CF | CF | CF | CF | CF | CF | CF | CF |
| | Copper Plate | CF | CF | CF | CF | CF | CF | CF | CF |
| | Aluminum plate | CF | CF | CF | CF | CF | CF | CF | AF |
| | Gold-coated plate | CF | CF | CF | CF | CF | CF | CF | AF |

*Measured at 20 rpm.

5% to 10% were designated by symbol A; and those coating that had deviations in thickness greater than 10% were designated by symbol X.

[Warping]

Warping was measured by fixing the long side of the sealed circuit board prior to cutting the product into individual pieces and measuring the height of lifting of the opposite long side.

[Resistance to Scratching]

The surface of the cured silicone body was scratched by a spatula made from a polypropylene resin, and then the following designations were used in evaluation of resistance to scratching:

X: significant white scratches on the surface;
Δ: thin white scratches on the surface; and
○: no scratches on the surface.

Application Example 2

Semiconductor devices were manufactured by the same method as in Application Example 1, except that the curable silicone composition of Reference Example 2 was used instead of the curable silicone composition of Reference Example 1 that was used in Application Example 1. Characteristics of the obtained semiconductor were evaluated in the same manner as in Application Example 1. Results are shown in Table 2.

Application Example 3

Semiconductor devices were manufactured by the same method as in Application Example 1, except that the curable silicone composition of Reference Example 3 was used instead of the curable silicone composition of Reference Example 1 that was used in Application Example 1. Characteristics of the obtained semiconductor were evaluated in the same manner as in Application Example 1. Results are shown in Table 2.

Application Example 4

Semiconductor devices were manufactured by the same method as in Application Example 1, except that the curable silicone composition of Reference Example 4 was used instead of the curable silicone composition of Reference Example 1 that was used in Application Example 1. Characteristics of the obtained semiconductor were evaluated in the same manner as in Application Example 1. Results are shown in Table 2.

Application Example 5

Semiconductor devices were manufactured by the same method as in Application Example 1, except that the curable silicone composition of Reference Example 5 was used instead of the curable silicone composition of Reference Example 1 that was used in Application Example 1. Characteristics of the obtained semiconductor were evaluated in the same manner as in Application Example 1. Results are shown in Table 2.

Application Example 6

Semiconductor devices were manufactured by the same method as in Application Example 1, except that the curable silicone composition of Reference Example 6 was used instead of the curable silicone composition of Reference Example 1 that was used in Application Example 1. Characteristics of the obtained semiconductor were evaluated in the same manner as in Application Example 1. Results are shown in Table 2.

Comparative Example 1

Semiconductor devices were manufactured by the same method as in Application Example 1, except that the curable epoxy resin composition of Reference Example 7 was used instead of the curable silicone composition of Reference Example 1 that was used in Application Example 1. Characteristics of the obtained semiconductor were evaluated in the same manner as in Application Example 1. Results are shown in Table 2.

Comparative Example 2

Semiconductor devices were manufactured by the same method as in Application Example 1, except that the curable silicone composition of Reference Example 8 was used instead of the curable silicone composition of Reference Example 1 that was used in Application Example 1. Characteristics of the obtained semiconductor were evaluated in the same manner as in Application Example 1. Results are shown in Table 2.

TABLE 2

| | Example No. | | | | | | | |
| | Application Examples | | | | | | Comp. Examples | |
| Characteristics | 1 | 2 | 3 | 4 | 5 | 6 | 1 | 2 |
| Appearance | ○ | ○ | ○ | ○ | ○ | ○ | Δ | ○ |
| Warping (mm) | 2 | 5 | 3 | 3 | 5 | 6 | 8 | 1 |
| Resistance to Scratching | ○ | ○ | ○ | ○ | ○ | ○ | ○ | X |

INDUSTRIAL APPLICABILITY

The method of the invention for manufacturing a semiconductor device provides sealing of semiconductor device in a cured silicone body that is free of voids, and the product is free of external defects and has good moisture-resistance properties. Furthermore, since the semiconductor devices of the invention are manufactured with precision control of thickness in the sealing resin. Based on the above, it can be stated that the method of the invention is suitable for the manufacture of miniature and thin electronic devices.

The invention claimed is:
1. A method of manufacturing a semiconductor device sealed in a cured silicone body, the method comprising the steps of:
  placing an unsealed semiconductor device into a mold; and
  subjecting a curable silicone composition which is fed into a space between the mold and the unsealed semiconductor device to compression molding;
  wherein the curable silicone composition comprises at least the following components:
  (A) an epoxy-containing silicone
  and
  (B) a curing agent for an epoxy resin;
  and wherein component (A) is ($A_1$) an organosiloxane which contains in one molecule at least two epoxy- containing univalent organic groups and which is represented by average unit formula:

$$(R^1{}_3SiO_{1/2})_a(R^2{}_2SiO_{2/2})_b(R^3SiO_{3/2})_c$$

wherein $R^1$, $R^2$, and $R^3$ may be the same or different and designate optionally substituted univalent hydrocarbon groups or epoxy-containing univalent groups, with the proviso that 20 mole % or more of $R^3$'s are aryl groups; and "a", "b", and "c" are numbers which satisfy the following conditions: $0 \le a \le 0.8$; $0 \le b \le 0.8$; $0.2 \le c \le 0.9$; and $(a+b+c)=1$;

and/or ($A_2$) a diorganosiloxane represented by the following general formula:

$$A\text{-}R^5\text{—}(R^4{}_2SiO)_m R^4{}_2Si\text{—}R^5\text{-}A$$

wherein $R^4$'s designate optionally substituted univalent hydrocarbon groups which are free of unsaturated aliphatic bonds; $R^5$'s designate bivalent organic groups; and A's designate siloxane residual radicals represented by the following average unit formula:

$$(XR^4{}_2SiO_{1/2})_d(SiO_{4/2})_e$$

wherein $R^4$ is the same as defined above; X is a single bond for bonding to $R^5$, a hydrogen atom, a group represented by $R^4$, an epoxy-containing univalent organic group, or an alkoxysilylalkyl group, with the proviso that at least one X of the above formula is a single bond and at least two X's are epoxy-containing univalent organic groups; "d" is a positive number; "e" is a positive number; and "d/e" is a positive number between 0.2 and 4; and "m" is an integer equal to or greater than 1.

2. The method of claim 1, wherein component (B) is a compound that contains a phenolic hydroxyl group.

3. A semiconductor device obtained by the method of claim 2.

4. The method of claim 2, wherein component (B) is an organosiloxane that contains in one molecule at least two phenolic hydroxyl groups.

5. The method of claim 4, wherein component (B) is an organosiloxane represented by the following general formula:

$$R^6{}_3SiO(R^6{}_2SiO)_n SiR^6{}_3$$

wherein $R^6$'s are optionally substituted univalent hydrocarbon groups or univalent organic groups that contain phenolic hydroxyl groups, with the proviso that at least two $R^6$'s are aforementioned univalent organic groups that contain phenolic hydroxyl groups; and "n" is an integer between 0 and 1,000.

6. A semiconductor device obtained by the method of claim 5.

7. The method of claim 1, wherein component (B) is contained in an amount of 0.1 to 500 parts by mass per 100 parts by mass of component (A).

8. The method of claim 1, wherein the curable silicone composition further contains (C) a curing accelerator.

9. The method of claim 8, wherein component (C) is an encapsulated amine-type curing accelerator.

10. The method of claim 8, wherein component (C) is contained in an amount of not more than 50 parts by mass per 100 parts by mass of component (A).

11. The method of claim 1, wherein the curable silicone composition further contains (D) a filler.

12. The method of claim 11, wherein component (D) is contained in an amount of not more than 2,000 parts by mass per 100 parts by mass of component (A).

13. The method of claim 1, wherein the curable silicone composition further contains (E) an organic epoxy compound.

14. The method of claim 13, wherein component (E) is contained in an amount of not more than 500 parts by mass per 100 parts by mass of component (A).

15. The method of claim 1, wherein the curable silicone composition further contains (F) a coupling agent.

16. The method of claim 15, wherein component (F) is contained in an amount of not more than 10 parts by mass per 100 parts by mass of component (A).

17. The method of claim 1, wherein the composite modulus of elasticity of a cured silicone body does not exceed 2 GPa.

18. A semiconductor device obtained by the method of claim 1.

* * * * *